(12) United States Patent
Eleftheriou et al.

(10) Patent No.: US 7,106,533 B2
(45) Date of Patent: Sep. 12, 2006

(54) APPARATUS, SYSTEM, AND METHOD FOR MITIGATING SIGNAL ASYMMETRY

(75) Inventors: Evangelos S. Eleftheriou, Zurich (CH); Ernest Stewart Gale, Tucson, AZ (US); Robert Allen Hutchins, Tucson, AZ (US); Glen Alan Jaquette, Tucson, AZ (US); Sedat Oelcer, Kilchberg (CH)

(73) Assignee: International Business Machines Corporation, Armonk, NY (US)

( * ) Notice: Subject to any disclaimer, the term of this patent is extended or adjusted under 35 U.S.C. 154(b) by 90 days.

(21) Appl. No.: 10/966,531

(22) Filed: Oct. 15, 2004

(65) Prior Publication Data

US 2006/0082915 A1 Apr. 20, 2006

(51) Int. Cl.
*G11B 20/10* (2006.01)
(52) U.S. Cl. .......................................... 360/39; 360/75
(58) Field of Classification Search .................. 360/55, 360/39, 49, 54, 61, 62, 65, 75; 341/118, 341/120; 327/172
See application file for complete search history.

(56) References Cited

U.S. PATENT DOCUMENTS

| | | | | |
|---|---|---|---|---|
| 4,725,968 A | | 2/1988 | Baldwin et al. ............ 364/550 |
| 4,746,902 A | * | 5/1988 | Tol et al. ..................... 341/118 |
| 5,121,260 A | | 6/1992 | Asakawa et al. ............... 36/31 |
| 5,283,521 A | | 2/1994 | Ottesen et al. ............... 324/225 |
| 5,294,949 A | | 3/1994 | Robison et al. ............. 354/106 |
| 5,793,547 A | * | 8/1998 | Fujii et al. ..................... 360/39 |
| 6,127,955 A | * | 10/2000 | Handel et al. ............... 341/120 |
| 6,191,714 B1 | * | 2/2001 | Langenbacher ............. 341/118 |
| 6,483,297 B1 | | 11/2002 | Sobey ......................... 324/210 |
| 6,665,134 B1 | | 12/2003 | Ottesen et al. ................. 360/31 |
| 6,671,111 B1 | | 12/2003 | Ottesen et al. ................. 360/31 |
| 6,690,311 B1 | * | 2/2004 | Lundin et al. ............... 341/120 |
| 6,744,389 B1 | * | 6/2004 | Haeberli et al. ............. 341/118 |
| 2002/0085298 A1 | | 7/2002 | Sobey .......................... 360/25 |
| 2002/0118438 A1 | | 8/2002 | Gowda et al. ............... 359/326 |
| 2005/0151571 A1 | * | 7/2005 | Brown et al. ................ 327/172 |

\* cited by examiner

Primary Examiner—Fred F. Tzeng
(74) Attorney, Agent, or Firm—Kunzler & Associates

(57) ABSTRACT

An apparatus, system, and method are disclosed for mitigating signal asymmetry. An analog to digital converter samples an analog signal from a read head and converts the sample to a digital input signal. The digital input signal addresses a look-up module, and the look-up module outputs a modified digital signal. The modified digital signal value is a specified function of the digital input signal value, wherein the specified function is configured to mitigate the asymmetry of the digital input signal. The modified digital signal value may be periodically recalculated to adjust for read head wear.

26 Claims, 9 Drawing Sheets

APPARATUS, SYSTEM, AND METHOD FOR MITIGATING SIGNAL ASYMMETRY

BACKGROUND OF THE INVENTION

1. Field of the Invention

This invention relates to digital signal processing and more particularly relates to digital signal processing to mitigate signal asymmetry.

2. Description of the Related Art

During the read process in a data storage device, a read head is typically passed over a data record in order to convert pre-recorded data into an analog signal. For example, in a magnetic tape drive, a magneto-resistive read head ("MRRH") is passed over a data record that has been previously written as flux reversals on a magnetic tape. As the MRRH is passed over the tape, the MRRH converts the flux reversals into an electrical analog signal that represents the data originally stored on the magnetic tape. An analog to digital converter ("ADC") periodically samples the analog signal and converts the sampled analog signal to a digital input signal. The ADC typically samples and converts a plurality of digital input signals forming a digital waveform. A data storage device such as a magnetic media storage device processes the digital waveform to reconstruct the data that was originally written to the tape.

The data waveform is typically recorded as flux reversals on a magnetic media and is symmetric, such that if the MRRH was perfectly adjusted, the received analog signal would be symmetric about a known reference level. For example, the analog signal may be symmetric about a reference level of zero volts (0 V). Unfortunately, manufacturing inconsistencies and read head wear may cause the read head to generate an asymmetric analog signal from the magnetic media. The asymmetric analog signal is converted to a plurality of digital input signals forming an asymmetric digital waveform. The asymmetry in the digital waveform increases the probability that the data storage device will interpret the asymmetric digital input signal incorrectly, resulting in an increased number of data errors.

Data errors due to a read head generating an asymmetric analog signal may make the read head unsuitable for shipment in a magnetic media storage device, increasing the failure rate and manufacturing costs of the read head. In addition, as the read head wears over time, the analog signals generated by these worn read heads will become more asymmetric. This shortens the life of the read head and the data storage device, increases the probability of an uncorrectable read error, and increases warranty costs.

From the foregoing discussion, it should be apparent that a need exists for an apparatus, system, and method that mitigates the asymmetry of a digital input signal waveform generated from an asymmetric analog signal. Beneficially, such an apparatus, system, and method would reduce the manufacturing defect rate and adapt the mitigation of the asymmetry over the life of the read head and storage system in order to compensate for changes in the read head with time.

SUMMARY OF THE INVENTION

The present invention has been developed in response to the present state of the art, and in particular, in response to the problems and needs in the art that have not yet been fully solved by currently available digital signal processing. Accordingly, the present invention has been developed to provide an apparatus, system, and method for mitigating asymmetry that overcome many or all of the above-discussed shortcomings in the art.

The apparatus to mitigate asymmetry is provided with a plurality of modules configured to functionally execute the necessary steps of mitigating asymmetry. These modules in the described embodiments include an analog to digital converter ("ADC") and a look-up module.

The ADC is configured to convert a sample of an analog signal to a digital input signal. In one embodiment, the analog signal is generated by a read head. In a certain embodiment, the read head is a magneto-resistive read head. The analog signal is configured to symmetrically oscillate about a specified reference level. In one embodiment, the specified reference level is a voltage of zero volts (0 V).

The look-up module is configured to receive the digital input signal from the ADC as an address input. In one embodiment, the look-up module is an addressable memory array such as a random access memory ("RAM"). Responsive to the digital input signal address the look-up module outputs an addressed digital value as a modified digital signal. The modified digital signal value is a specified function of the digital input signal value used to address the look-up module. The specified function is configured to mitigate the asymmetry of the modified digital signal as a function of the digital input signal. A plurality of modified digital signal values may form a modified digital waveform that may be interpreted to reconstruct data. The apparatus mitigates asymmetry using the look-up module to output a modified digital signal.

A system of the present invention is also presented to mitigate asymmetry. The system may be embodied in a data storage device such as a magnetic media storage device. In particular, the system, in one embodiment, includes a storage media, a read head, an ADC, a look-up module, a read module, and a storage device controller.

The storage media is configured with a data record. In one embodiment, the storage media is a magnetic storage media such as magnetic tape, and the data record is a magnetic data record that was pre-recorded on the magnetic tape. The read head is configured to generate an analog signal from the data record. The ADC converts a sample of the analog signal to a digital input signal. The digital input signal addresses a data value in the look-up module. The look-up module outputs an addressed digital value as a modified digital signal. The modified digital signal value is a specified function of the digital input signal value.

The ADC and look-up module may generate a plurality of modified digital signals. The read module is configured to convert the plurality of modified digital signals to digital data. The read module may communicate the digital data to the storage device controller. The storage device controller may communicate the digital data to a host system such as a storage server.

A method of the present invention is also presented for mitigating asymmetry. The method in the disclosed embodiments substantially includes the steps necessary to carry out the functions presented above with respect to the operation of the described apparatus and system. In one embodiment, the method includes converting an analog signal to a digital input signal, addressing a look-up module with the digital input signal, and outputting an addressed digital value as a modified digital signal. In one embodiment, the method also includes determining a positive peak of the digital input signal waveform or digital waveform, determining the negative peak of the digital waveform, calculating a specified value α, determining the digital input signal range, calculating modified digital signal values, and storing the modified digital signal values.

An ADC converts an analog signal to a digital input signal. The ADC addresses a look-up module with the digital input signal. The look-up module outputs as addressed digital value as a modified digital signal. The modified digital signal value is a specified function of the digital input signal value. The specified function is configured to mitigate the asymmetry of the modified digital signal.

In one embodiment, the read module determines a peak positive digital input signal value. In addition, the read module determines a peak negative digital input signal value. A storage device controller calculates the specified value α and may determine the digital input signal range. In addition, the storage device controller may calculate a modified digital signal value as a specified function of each digital input signal value and store each modified digital signal value at each corresponding digital input signal value address of the look-up module. In one embodiment, the storage device controller may periodically recalculate and store the modified digital signal values to adjust for read head wear.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention can be practiced without one or more of the specific features or advantages of a particular embodiment. In other instances, additional features and advantages may be recognized in certain embodiments that may not be present in all embodiments of the invention.

The present invention employs a look-up module configured as a look-up table in an addressable memory array to generate a modified digital signal when addressed by a digital input signal. Asymmetry in the digital input signal is mitigated in the modified digital signal, reducing read errors from the modified digital signal. These features and advantages of the present invention will become more fully apparent from the following description and appended claims, or may be learned by the practice of the invention as set forth hereinafter.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE INVENTION

Figure 1:
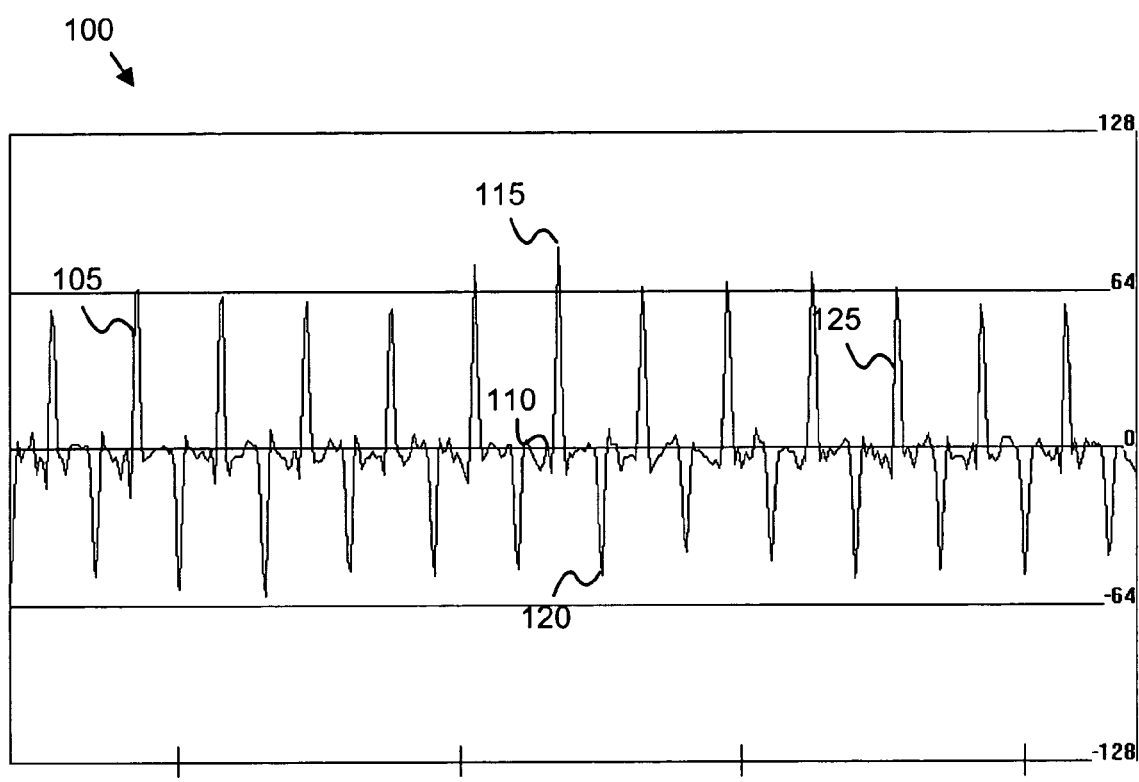
FIG. 1 illustrates one embodiment of a digital input signal waveform with significant asymmetry of the present invention.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of executable code may, for instance, comprise one or more physical or logical blocks of computer instructions, which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network.

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Furthermore, the described features, structures, or characteristics of the invention may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the invention. One skilled in the relevant art will recognize, however, that the invention can be practiced without one or more of the specific details, or with other methods, components, materials, and so forth. In other instances, well-known structures, materials, or operations are not shown or described in detail to avoid obscuring aspects of the invention.

FIG. 1 illustrates one embodiment of a digital input signal waveform plot 100 with significant asymmetry. A digital input signal waveform or digital waveform 125 is comprised of a plurality of digital input signals 105 and is plotted as a function of time, with signal amplitude on the vertical axis and time on the horizontal axis. In addition, the digital waveform 125 is centered at a specified reference level 110. In the depicted embodiment, the reference level 110 is zero volts (0 V). The digital waveform 125 may contain a data record such as the data record of a storage media or it may contain fixed patterns that can be used by the read module to start/stop the decoding of data or be used to measure head asymmetry as shown in FIG. 1.

The digital waveform 125 may include a positive peak 115 and a negative peak 120. In the depicted embodiment, the positive peak 115 and the negative peak 120 are asymmetric about the reference level 110. The average digitized positive peak 115 amplitude is approximately sixty and the average digitized negative peak 120 amplitude is approximately forty-eight. The asymmetry is calculated as (60−48)/(60+48) which equals approximately eleven percent (11%). Although this amount of asymmetry will not prevent the accurate conversion the digital input signals 105 to data in a noise-free environment, the data storage environment is not noise-free. The asymmetry reduces the margin to failure and thus, in the data storage environment, there are more errors with an asymmetric waveform than with a waveform that has no asymmetry. The present invention mitigates the asymmetry of the digital input signal and reduces the instances of failure.

Figure 2:
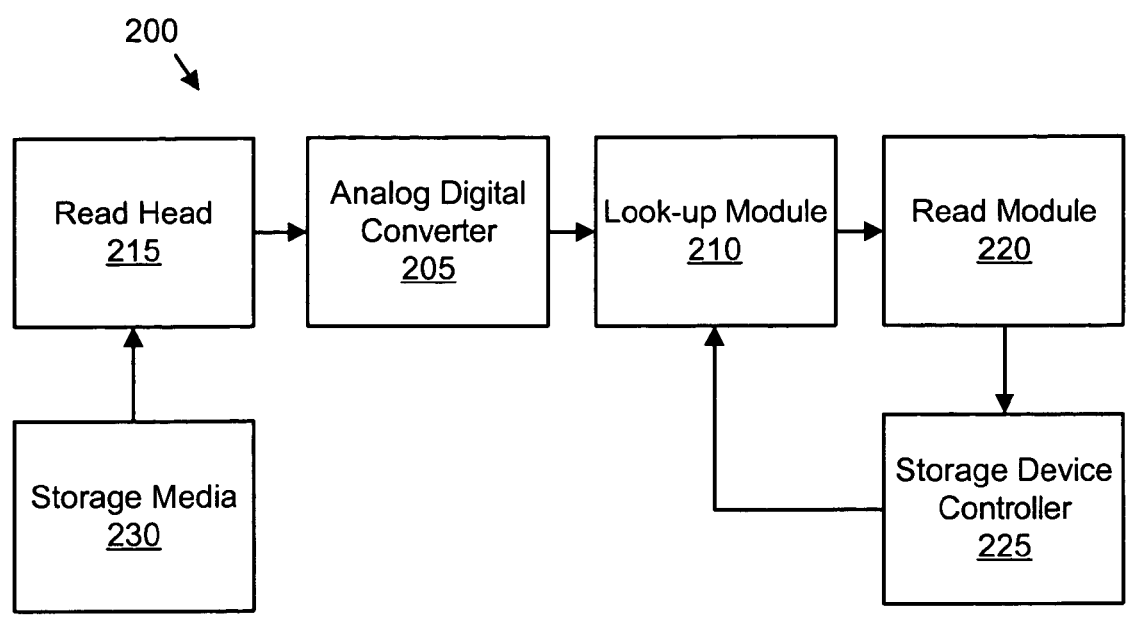
FIG. 2 is a schematic block diagram of one embodiment of an asymmetry mitigation system in accordance with the present invention.

FIG. 2 is a schematic block diagram of one embodiment of an asymmetry mitigation system 200 in accordance with the present invention. In particular, the system 200, in one embodiment, includes a storage media 230, a read head 215, an analog to digital converter ("ADC") 205, a look-up module 210, a read module 220, and a storage device controller 225.

The storage media 230 is configured with a data record. In one embodiment, the storage media 230 is a magnetic storage media such as magnetic tape and the data record is a magnetic data record. The magnetic data record may be created by polarizing magnetic elements in the storage media 230. In an alternate embodiment, the storage media 230 is an optical storage media and the read head 215 is a laser/detector configured to detect reflectivity differences in the storage media 230.

The read head 215 is configured to generate an analog signal from the data record. In one embodiment, the storage media 230 passes over the read head 215 and generates an analog signal. The ADC 205 converts a sample of the analog signal to a digital input signal 105. In one embodiment, the digital input signal 105 is a digitally encoded value such as a twos compliment binary value. The ADC 205 may convert a plurality of analog signal samples to a plurality of digital input signals 105. The plurality of digital input signals 105 may form a digital waveform 125. The digital waveform 125 is a sampled, quantized version of the analog signal.

In one example, if the read head 215 is manufactured with inconsistencies, the read head 215 may generate an asymmetric digital waveform 125. In an alternative example, the read head 215 may wear over time and generate an asymmetric analog signal that is converted to an asymmetric digital waveform 125. The present invention mitigates the asymmetry of the digital waveform 125 to reduce the data errors of the system 200.

In one embodiment of the invention, the digital input signal 105 addresses a digital data value in the look-up module 210. The look-up module 210 outputs the addressed digital value as a modified digital signal. The modified digital signal value is a specified function of the digital input signal 105 value based upon asymmetry measurements and calculations made by the Storage Device Controller 225 and the Read Module 220. In one embodiment, the look-up module 210 is addressed sequentially by the plurality of digital input signals 105 and outputs a plurality of modified digital signals that form a modified digital waveform with mitigated asymmetry.

The read module 220 is configured to convert the plurality of modified digital signals to digital data. In one embodiment, the read module 220 identifies a positive peak 115 or negative peak 120 as a data value. For example, a positive peak 115 or negative peak 120 may represent a digital one (1) while the absence of a positive peak 115 or negative peak 120 may represent a digital zero (0). The read module 220 may communicate the digital data to the storage device controller 225. The storage device controller 225 may communicate the digital data to a host system such as a storage server. The system 200 employs the look-up module 210 to mitigate the asymmetry of the digital input signal 105 by outputting a modified digital signal.

Figure 3:
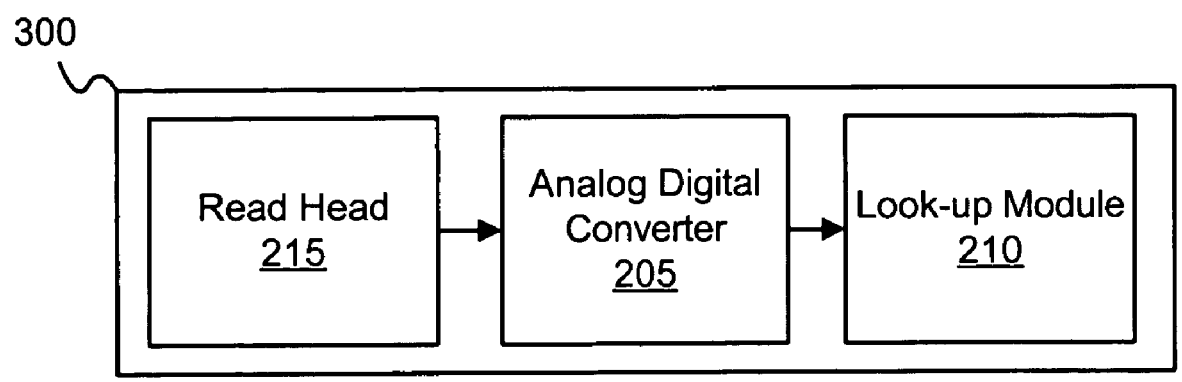
FIG. 3 is a schematic block diagram of one embodiment of an asymmetry mitigation apparatus in accordance with the present invention.

FIG. 3 is a schematic block diagram of an asymmetry mitigation apparatus 300 in accordance with the present invention. The ADC 205 is configured to convert a sample of an analog signal to a digital input signal. An asymmetric analog signal generates digital input signals 105 forming an asymmetric digital waveform 125 that may cause data The look-up module 210 is configured to receive the digital input signal 105 as an address. In one embodiment, the look-up module 210 is an addressable memory array such as a random access memory ("RAM"). In a certain embodiment, the addressable memory array is a dynamic random access memory ("DRAM"). A storage device controller 225 may load the digital values to the look-up module 210. For example, the storage device controller 225 may measure the asymmetry of the digital input signal 105 or the modified digital signal and calculate a modified digital signal value for each digital input signal 105 value based on the measured asymmetry. The storage device controller 225 may further load the modified digital signal values to the look-up module 210 at the digital input signal 105 value addresses. In an alternate embodiment, the addressable memory array is a non-volatile flash RAM. In a certain embodiment, the look-up module 210 is fabricated with the digital values in a memory array.

Responsive to the digital input signal 105 address, the look-up module 210 outputs an addressed digital value as a modified digital signal. The modified digital signal value is a specified function of the digital input signal 105 value used to address the look-up module 210. The specified function is configured to mitigate the asymmetry of the modified digital signal as a function of the digital input signal 105. A plurality of modified digital signal values may form a modified digital waveform that may be interpreted to reconstruct data. The apparatus 300 mitigates asymmetry using a look-up module 210 to output a modified digital signal.

Figure 4:
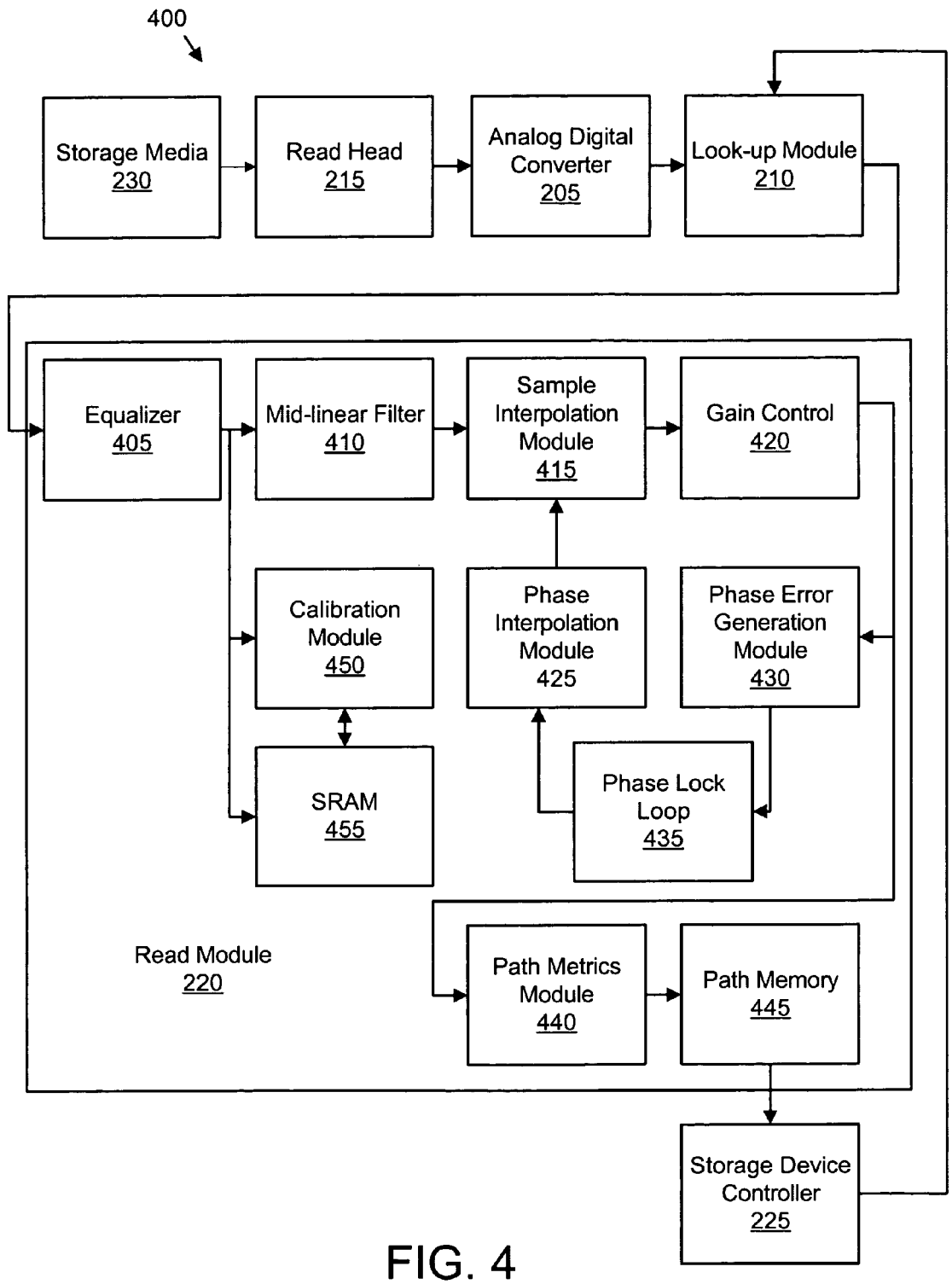
FIG. 4 is a schematic block diagram of one embodiment a data storage device of the present invention.

FIG. 4 is a schematic block diagram of one embodiment of a data storage device 400 of the present invention. The data storage device 400 includes the storage media 230, the read head 215, the ADC 205, the look-up module 210, the read module 220, and the storage device controller 225 of the asymmetry mitigation system 200 of FIG. 2. In addition, the read module 220 includes an equalizer 405, a mid-linear filter 410, a sample interpolation module 415, a gain control 420, a phase interpolation module 425, a phase error generation module 430, a phase lock loop 435, a path metrics module 440, a path memory module 445, a calibration module 450 and a SRAM 455. The equalizer 405, mid-linear filter 410, sample interpolation module 415, gain control 420, phase interpolation module 425, phase error generation module 430, phase lock loop 435, path metrics module 440, and path memory module 445 convert the modified digital signal to digital data as is well known by those skilled in the art.

The calibration module 450 and SRAM 455 may perform calibration functions. In one embodiment, the calibration module 450 determines the magnitude of a positive peak and a negative peak. In one embodiment, the positive peak is a positive peak 115 of the digital waveform 125 and the negative peak is a negative peak 120 of the digital waveform 125. In an alternate embodiment, the positive peak is a positive peak of a modified digital waveform and the negative peak is a negative peak of the modified digital waveform. In a certain embodiment, the magnitude of the positive peak is the average magnitude of a plurality of positive peaks and the magnitude of the negative peak is the average magnitude of a plurality of negative peaks.

As one example of a manner of operation, the calibration module 450 may accumulate the sum of the magnitudes of the positive peaks for a specified number of positive peaks, and accumulate the sum of the magnitudes of the negative peaks for a specified number of negative peaks. The storage device controller 225 reads the sums and numbers of peaks and divides the sum of the positive peak magnitudes by the specified number of positive peaks to calculate the average magnitude of the positive peak. Likewise, the storage device controller 225 divides the sum of the negative peak magnitudes by the specified number of negative peaks to calculate the average magnitude of the negative peak. The average positive peak magnitude and the average negative peak magnitude are used to calculate the asymmetry and α and determine the modified digital signal values that are stored in the look-up module 210.

In another embodiment, an SRAM 455 is used to store digitized waveform data. In this embodiment, the storage device controller 225 post-processes the data and determines the magnitude of a positive peak and a negative peak using software algorithms. In one embodiment, the positive peak is a positive peak 115 of the digital waveform 125 and the negative peak is a negative peak 120 of the digital waveform 125. In an alternate embodiment, the positive peak is a positive peak of a modified digital waveform and the negative peak is a negative peak of the modified digital waveform.

In a certain embodiment, the magnitude of the positive peak is the average magnitude of a plurality of positive peaks and the magnitude of the negative peak is the average magnitude of a plurality of negative peaks. For example, the storage device controller 225 may accumulate the sum of the magnitudes of the positive peaks and accumulate the number of positive peaks for the waveform stored in the SRAM 455. Likewise, the storage device controller 225 may accumulate the sum of the magnitudes of the negative peaks and accumulate the number of negative peaks for the waveform stored in the SRAM 455.

The storage device controller 225 divides the sum of the positive peak magnitudes by the number of positive peaks to calculate the average magnitude of the positive peak. Likewise, the storage device controller 225 divides the sum of the negative peak magnitudes by the number of negative peaks to calculate the average magnitude of the negative peak. The average positive peak magnitude and the average negative peak magnitude are used to calculate the asymmetry and α and determine the modified digital signal values that are stored in the look-up module 210.

Figure 5:
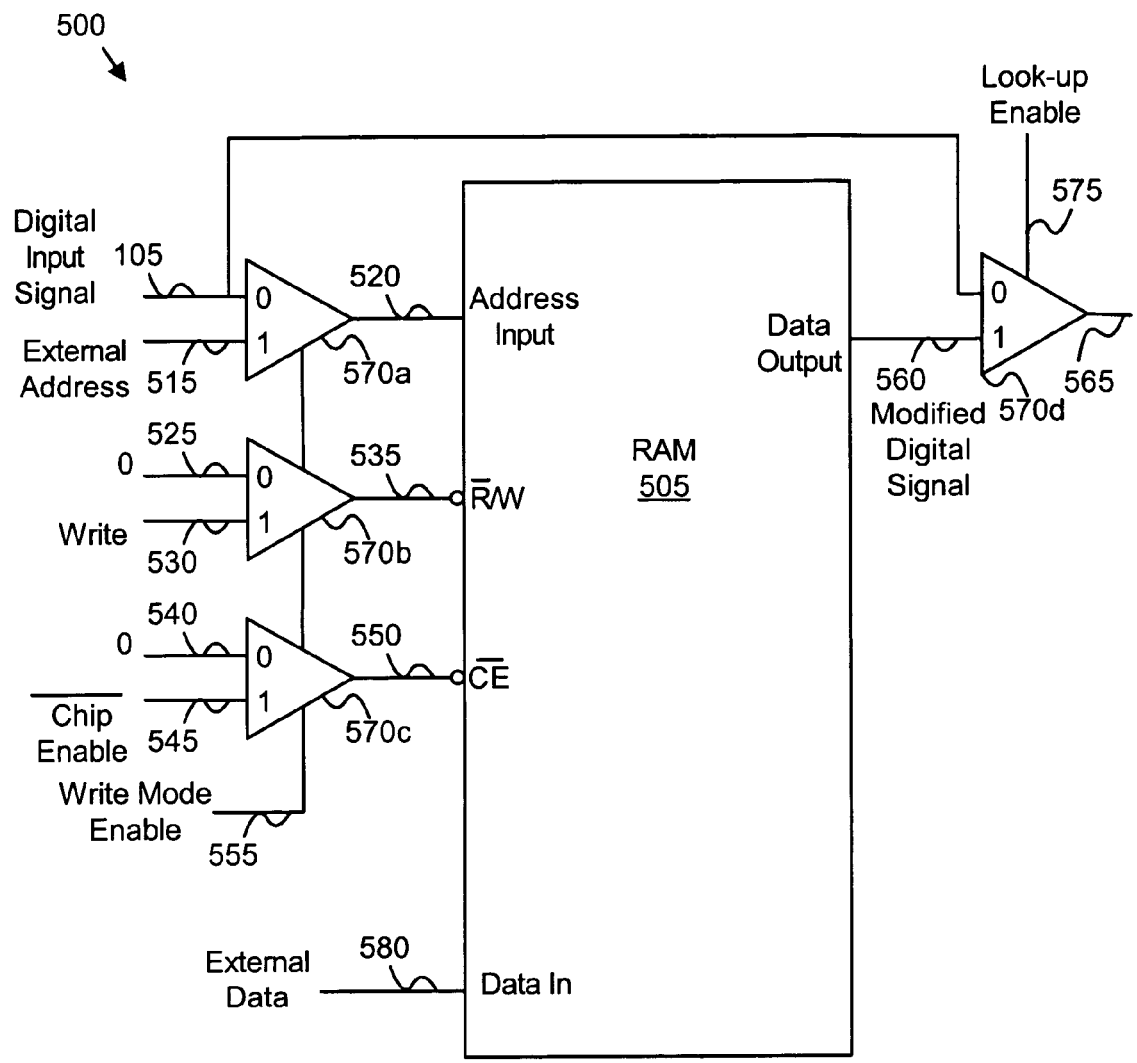
FIG. 5 is a schematic block diagram of one embodiment of a look-up module 500 of the present invention.

FIG. 5 is a schematic block diagram of one embodiment of a look-up module 500 of the present invention. The look-up module 500 includes a RAM 505 and one or more multiplexers 570. In one embodiment, the RAM 505 is a two hundred fifty six by eight (256×8) RAM. The digital input signal 105, the external address 515, the address input 520, data output 560, data in 580 and modified data signal 565 are configured as digital signal buses.

The asserted write mode enable signal 555 switches the output of the multiplexers 570*a*, 570*b*, 570*c* to the one (1) input, enabling the RAM 505 to be written to. A storage device controller 225 may set up an external data value on the data in bus 580 and an external address value on the external address bus 515. The external data value is a modified digital signal value and the external address is a corresponding digital input signal value 105. The chip enable 545 signal allows the RAM 505 to be written to when the external address value and external data value are set up. The write signal 530 to the R/W input 535 writes the external data value to the address specified by the external address.

If the write mode enable signal 555 is de-asserted, the multiplexer 570*a* outputs the digital input signal 105 from the ADC 210 to the RAM's 505 address input 520 bus. The RAM 505 outputs the modified digital signal 560 value corresponding to the digital input signal 105 address value on the data output bus. In one embodiment, the look-up enable signal 575 selects the data output bus for output to the read module 220 from the multiplexer 570*d* if the look-up enable signal 575 is asserted. If the look-up enable signal 575 is de-asserted, the multiplexer 570*d* outputs the digital input signal 105.

The schematic flow chart diagrams that follow are generally set forth as logical flow chart diagrams. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method.

Additionally, the order in which a particular method occurs may or may not strictly adhere to the order of the corresponding steps shown.

Figure 6:
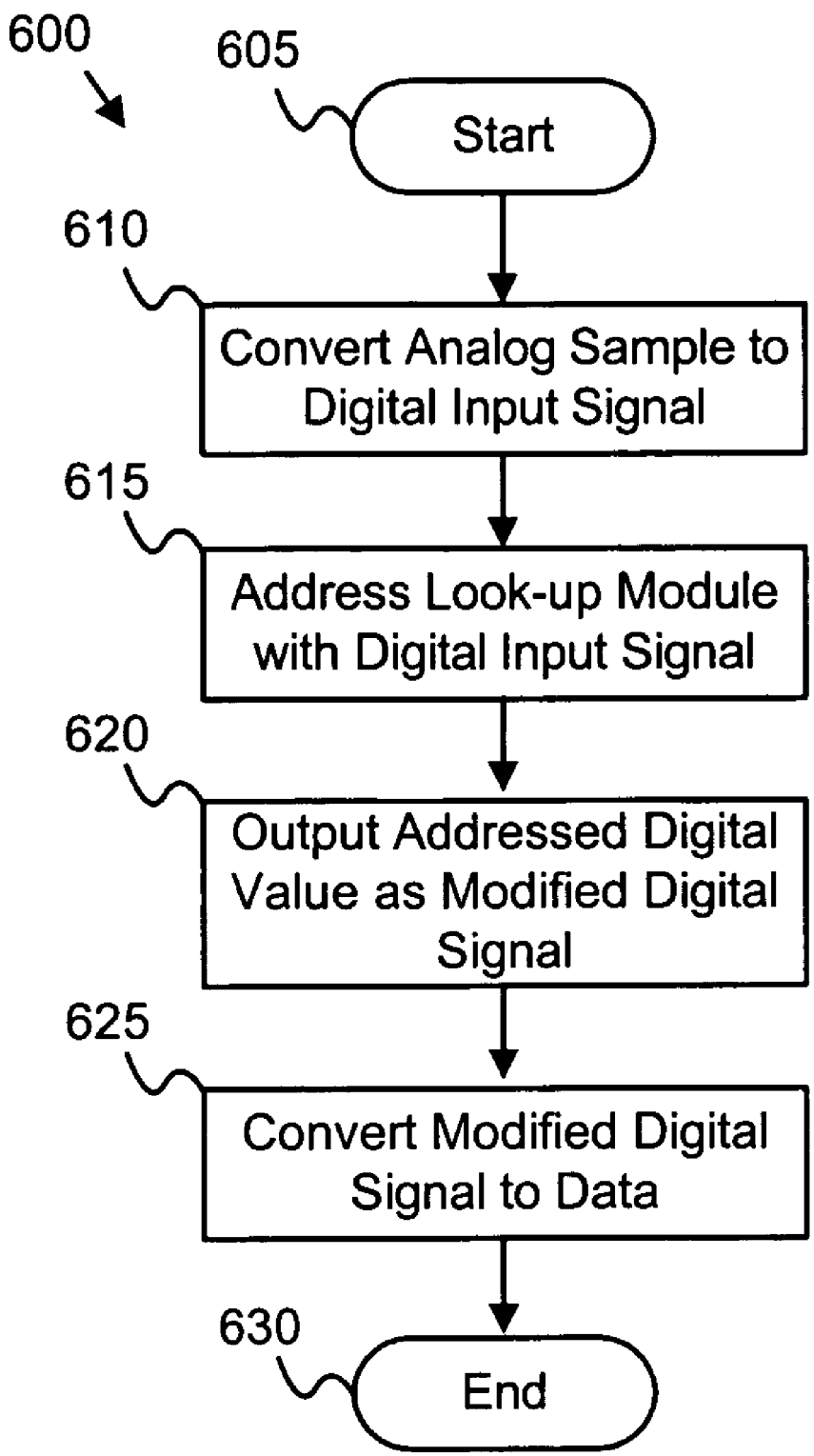
FIG. 6 is a schematic flow chart diagram illustrating one embodiment of an asymmetry mitigation method in accordance with the present invention.

FIG. 6 is a schematic flow chart diagram illustrating one embodiment of an asymmetry mitigation method 600 in accordance with the present invention. The method 600 begins 605 and an ADC 205 converts 610 a sample of an analog signal to a digital input signal 105. The ADC 205 may sample the analog signal a plurality of times and convert 610 the plurality of samples to a plurality of digital input signals 510.

In one embodiment, the analog signal is formed by a read head 215 in response to a data record on a storage media 230. For example, the storage media 230 may be a magnetic tape and the read head 215 a magneto-resistive read head. A magnetic data record is pre-recorded on the magnetic tape as variations in magnetic polarity. The magneto-resistive read head 215 converts the variations in magnetic polarity on the magnetic tape into an analog signal. The analog signal is converted input a digital input signal 105 which may vary around reference level 110 in normal operation, with positive peaks 115 and negative peaks 120. In one embodiment, the data of the data record is more reliably reconstructed if the digital input signal 105 is symmetrical about the reference level 110.

The digital input signal 105 of the ADC 205 addresses 615 the look-up module 210. The look-up module 210 may be configured as an addressable memory array such as a RAM 505. The digital input signal 105 value addresses a corresponding digital value. The look-up module 210 outputs 620 the addressed digital value as a modified digital signal 560. The modified digital signal 560 value is a specified function of the digital input signal 105 value 520. The specified function is configured to mitigate the asymmetry of the modified digital signal.

In one embodiment, an asymmetric analog signal approximates a quadratic function of the desired symmetric analog signal. Thus in a certain embodiment, the specified function is Equation 1, where x is the modified digital signal 560 value, y is the digital input signal 105 value, and α is a specified value.

$$x = \frac{-1 + \sqrt{1 + 4\alpha y}}{2\alpha} \quad \text{Equation 1}$$

In one embodiment, α is calculated using Equation 2, where $Y_P$ is the magnitude of a positive peak 115 of the digital waveform 125 and $Y_N$ is the magnitude of a negative peak 120 of the digital waveform 125.

$$\alpha = \frac{2(Y_P - Y_N)}{(Y_P + Y_N)^2} \quad \text{Equation 2}$$

The look-up module 210 applies the specified function to the digital input signal 105, mitigating the asymmetry of the resulting modified digital signal 560. In one embodiment, a read module 220 converts 625 the modified digital signal 560 to data and the method 600 terminates 630. The method 600 mitigates the modified digital signal 560 asymmetry by using the look-up module 210 to modify the digital input signal 105 by the specified function and may reduce the data errors from converting 625 the modified digital signal 560 to data.

Figure 7:
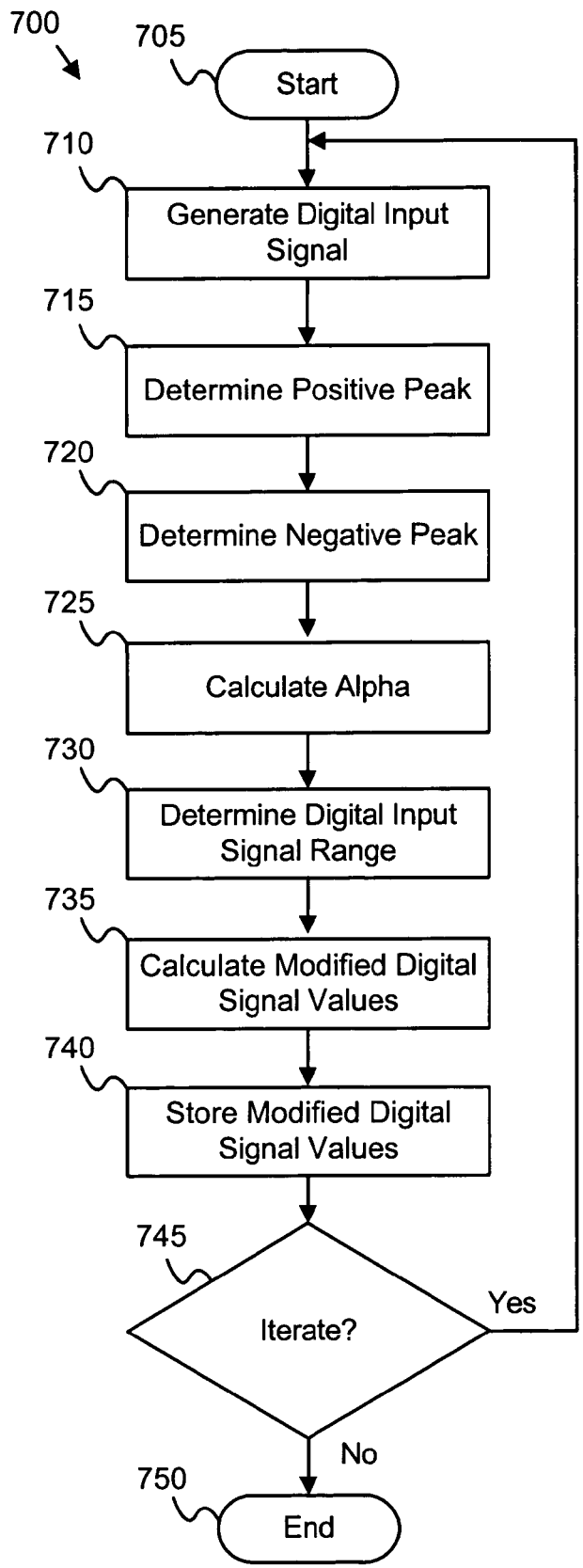
FIG. 7 is a schematic flow chart diagram illustrating one embodiment of a modified digital signal value calculation method in accordance with the present invention.

FIG. 7 is a schematic flow chart diagram illustrating one embodiment of a modified digital signal value calculation method 700 in accordance with the present invention. In one embodiment, the method 700 starts 705 and the ADC 205 generates 710 digital input signals 520. The ADC 205 may convert a plurality of samples from an analog signal. The analog signal may be generated by a read head 215. The ADC 205 converts the samples to a plurality of digital input signals 105. In a certain embodiment, the look-up module 210 passes the plurality of digital input signals 105 to the read module 220 unmodified. For example, a storage device controller 225 may de-assert the look-up enable signal 575 as shown in FIG. 5 to pass the plurality of digital input signals 105 unmodified.

The read module 220 determines 715 the magnitude of a peak positive 115 digital input signal 105 value, $Y_P$. In addition, the read module 220 determines 720 the magnitude of a peak negative 120 digital input signal 105 value, $Y_N$. In a certain embodiment, the magnitude of the peak positive 115 and the magnitude of the peak negative 120 are average peak magnitudes. In one embodiment, a calibration module 450 determines the peak positive 115 and peak negative 120 magnitudes. In another embodiment, digitized waveforms are stored in an SRAM 455 and are post-processed by the device storage controller 225 to determine the peak positive 115 and peak negative 120 magnitudes or used to make other estimates of asymmetry. The storage device controller 225 may calculate 725 α using Equation 2 as described above. In an alternate embodiment, a user may calculate 725 α offline using Equation 2.

In one embodiment, the storage device controller 225 determines 730 the digital input signal 105 range. In an alternate embodiment, a user may determine 730 the digital input signal 105 range. For example, the digital input signal 105 range may span the digital integer values from negative one hundred and twenty eight (−128) to positive one hundred and twenty seven (127).

The storage device controller 225 may calculate 735 a modified digital signal 560 value for each digital input signal 105 value. In an alternate embodiment, a user may calculate 735 the modified digital signal 560 value for each digital input signal 105 value. The storage device controller 225 may further store 740 each modified digital signal 560 value at each corresponding digital input signal 105 value address of the look-up module 210. In an alternate embodiment, the users may store 740 each modified digital signal 560 value at each corresponding digital input signal 105 value address of the look-up module 210.

In one embodiment, the storage device controller 225 determines 745 whether to iterate the modified digital signal value calculation method 700. In one embodiment, the storage device controller 225 periodically loops to generate 710 the digital input signals 520 and repeat the method 700. Iterating the method 700 adapts the mitigation of the digital waveform 125 asymmetry over the life of the read head 215. For example, the asymmetry of an analog signal may increase over time as the read head 215 wears. Iterating the method 700 adapts the mitigation of the asymmetry to the changing asymmetry of the read head 215 and may prolong the life of the read head 215. In an alternate embodiment, the storage device controller 225 terminates 750 the method 700. The method 700 calculates 735 and stores 740 the modified digital signal 560 values in the look-up module 210.

Figure 8:
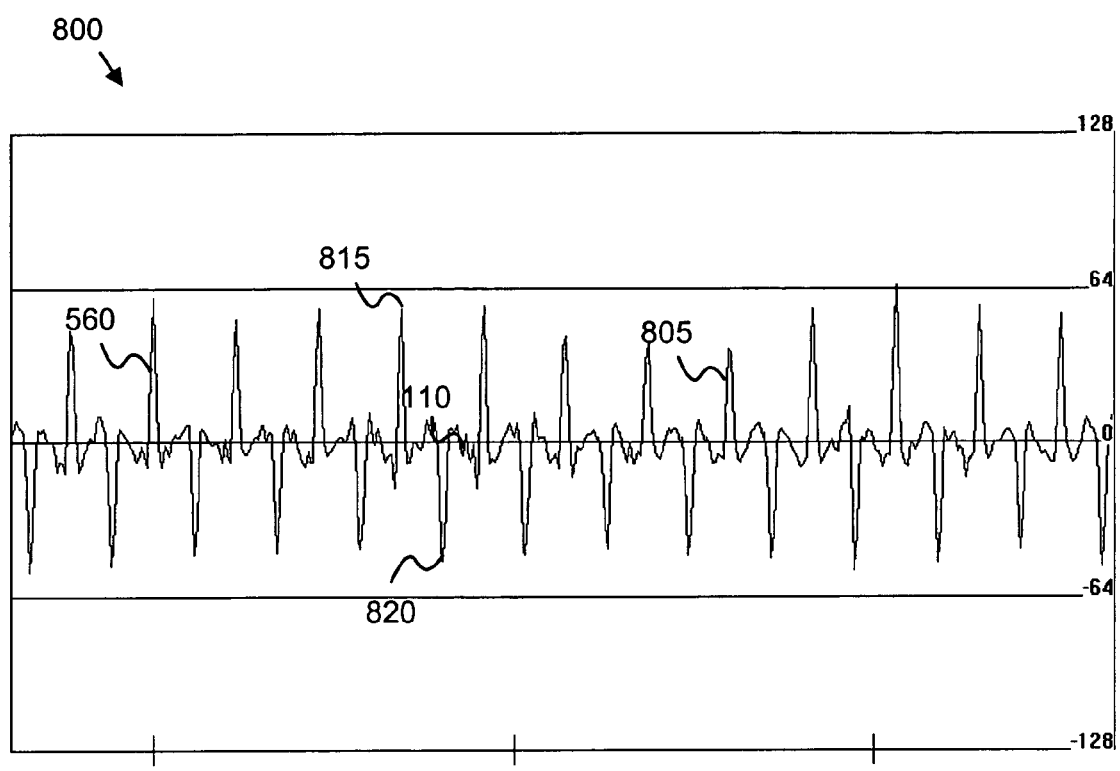
FIG. 8 is a modified digital waveform plot of the present invention.

FIG. 8 is a modified digital waveform plot 800 of the present invention. A modified digital waveform 805 represents a plurality of modified digital signal 560 values generated from the digital input signal 105 values of FIG. 1. The positive peak 815 and the negative peak 820 are more symmetric, showing the mitigation of the asymmetry of the digital waveform 125.

Figure 9:
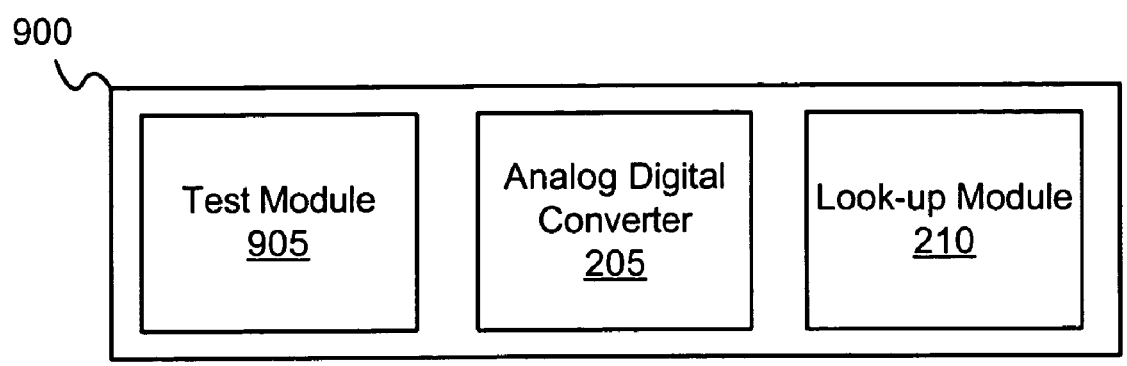
FIG. 9 is a schematic block diagram of one embodiment of an analog to digital device of the present invention.

FIG. 9 is a schematic block diagram of one embodiment of an analog to digital conversion device 900 of the present invention. The device 900 includes an ADC 205, a look-up module 210, and a test module 905. In a certain embodiment, the device 900 is an integrated element of a semiconductor device. In one embodiment, the ADC 205 converts a plurality of samples of the analog signal and generates 710 a plurality of digital input signals 105. The test module 905 determines 715 the magnitude of a positive peak 115 $Y_P$ and determines 720 the magnitude of a negative peak 120 $Y_N$ from the plurality of digital input signals 105. Subsequently, the test module 905 calculates 725 a value α using Equation 2 and calculates 735 a plurality of modified digital signal 560 values using Equation 1. In addition, the test module 905 may store 740 the modified digital signal 560 values to the look-up module 210. The ADC 205 converts 610 the analog signal to a digital input signal 105 and the look-up module outputs the modified digital signal 560 in response to the digital input signal 105.

The present invention employs a look-up module 210 configured to generate a modified digital signal 560 when addressed by a digital input signal 105. Asymmetry in the digital input signal 105 is mitigated in the modified digital signal 560, reducing read errors from the modified digital signal 560. The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus to mitigate asymmetry, the apparatus comprising:
   an analog to digital converter configured to convert a sample of an analog signal that oscillates about a specified reference level to a digital input signal; and
   a look-up module configured to receive the digital input signal as an address input and output an addressed digital value as a modified digital signal, wherein the modified digital signal value is a specified function of the digital input signal value and is configured to mitigate the asymmetry of the digital input signal, wherein the specified function involves calculating the modified digital signal value x as a function of the digital input signal value y using the equation $$x = \frac{-1 + \sqrt{1 + 4\alpha y}}{2\alpha}$$

where α is a specified value.

2. The apparatus of claim 1, further comprising a system controller configured to calculate a plurality of modified digital signal values from a plurality of digital input signal values and store the modified digital signal values as the digital input signal values in the look-up module.

3. The apparatus of claim 2, wherein the storage device controller is configured to periodically calculate the plurality of modified digital signal values and store the modified digital signal values as the digital input signal values in the look-up module.

4. The apparatus of claim 1, wherein α is calculated by the equation $$\alpha = \frac{2(Y_P - Y_N)}{(Y_P + Y_N)^2}$$

wherein $Y_P$ is the magnitude of an average positive peak of a digital input signal waveform and $Y_N$ is the magnitude of an average negative peak of the digital input signal waveform.

5. The apparatus of claim 1, further comprising a read head configured to convert a data record to the analog signal.

6. The apparatus of claim 1, wherein the read head is configured as a magneto-resistive read head and the data record is configured as a magnetic data record.

7. The apparatus of claim 1, wherein the look-up module is configured as an addressable memory array fabricated as a plurality of semiconductor gates.

8. An analog to digital conversion device, comprising:
   an analog to digital converter configured to convert a sample of an analog signal that oscillates about a specified reference level to a digital input signal;
   a look-up module configured as an addressable memory array and configured to receive the digital input signal as an address input and output an addressed digital value as a modified digital signal, wherein the modified digital signal value is a specified function of the digital input signal value, and is configured to mitigate the asymmetry of the digital input signal; and
   a test module configured to determine an average positive peak $Y_P$ and an average negative peak $Y_N$ of a digital input signal waveform, calculate α where $$\alpha = \frac{2(Y_P - Y_N)}{(Y_P + Y_N)^2}$$

and to calculate a plurality of modified digital signal values x as a function of a plurality of digital input signal values y using the equation $$x = \frac{-1 + \sqrt{1 + 4\alpha y}}{2\alpha}.$$

9. A system to mitigate signal asymmetry, the system comprising:
   a storage device configured to record a data record;
   a read head configured to generate an analog signal that oscillates about a specified reference level from a data record;
   a analog to digital converter configured to convert a sample of the analog signal to a digital input signal;
   a look-up module configured to receive the digital input signal as an address input and output an addressed digital value as a modified digital signal wherein the modified digital signal value is a specified function of the digital input signal value, and is configured to mitigate the asymmetry of the digital input signal, wherein the specified function involves calculating the modified digital signal value x as a function of the digital input signal value y by the equation $$x = \frac{-1 + \sqrt{1 + 4\alpha y}}{2\alpha}$$

wherein α is a specified value; and a read module configured to convert the modified digital signal to digital data.

10. The system of claim 9, wherein α is calculated by the equation $$\alpha = \frac{2(Y_P - Y_N)}{(Y_P + Y_N)^2}$$

where $Y_p$ is the magnitude of an average positive peak of a digital input signal waveform and $Y_N$ is the magnitude of an average negative peak of the digital input signal waveform.

11. The system of claim 9, further comprising a system controller configured to calculate a plurality of modified digital signal values from a plurality of digital input signal values and store the modified digital signal values as the digital input signal values in the look-up module.

12. The system of claim 11, wherein the storage device controller is configured to periodically calculate the plurality of modified digital signal values and store the modified digital signal values as the digital input signal values in the look-up module.

13. The system of claim 9, wherein the look-up module is configured as an addressable memory array.

14. The system of claim 13, wherein the addressable memory array is configured as a random access memory.

15. The system of claim 9, wherein the read head comprises a magneto-resistive read head and the data record comprises a magnetic data record.

16. A signal bearing medium tangibly embodying a program of machine-readable instructions executable by a digital processing apparatus to perform operations to mitigate asymmetry, the operations comprising:

converting a sample of an analog signal that oscillates about a specified reference level to a digital input signal;

addressing a look-up module; and outputting an addressed digital value as a modified digital signal wherein the modified digital signal value is a specified function of the digital input signal value, that is configured to mitigate the asymmetry of the digital input signal, wherein the specified function involves calculating the modified digital signal value x as a function of the digital input signal value y by the equation $$x = \frac{-1 + \sqrt{1 + 4\alpha y}}{2\alpha}$$

where α is a specified value.

17. The signal bearing medium of claim 16, wherein α is calculated using the equation $$\alpha = \frac{2(Y_P - Y_N)}{(Y_P + Y_N)^2}$$

where $Y_p$ is the magnitude of a positive peak of a digital input signal waveform and $Y_N$ is the magnitude of a negative peak of the digital input signal waveform.

18. The signal bearing medium of claim 17, wherein the instructions further comprise operations to periodically recalculate a plurality of modified digital signal values from a plurality of digital input signal values.

19. The signal bearing medium of claim 17, wherein the instructions further comprise operations to measure the magnitude of the positive and negative peaks of the digital input signal waveform.

20. The signal bearing medium of claim 19, wherein the instructions further comprise operations to store the modified digital signal values to the look-up module at the digital signal value addresses.

21. The signal bearing medium of claim 19, wherein the instructions further comprise operations to measure the magnitude of the positive peaks of the digital input signal waveform as being the average magnitude of the positive peaks and measure the magnitude of the negative peaks of the digital input signal waveform as being the average magnitude of the negative peaks.

22. A method for mitigating asymmetry, the method comprising:

converting a sample of an analog signal that oscillates about a specified bias level to a digital input signal;

addressing a look-up module with the digital input signal; and outputting an addressed digital value as a modified digital signal wherein the modified digital signal value is a specified function of the digital input signal value, and is configured to mitigate the asymmetry of the digital input signal, wherein the specified function involves calculating the modified digital signal value x as a function of the digital input signal value y by the equation $$x = \frac{-1 + \sqrt{1 + 4\alpha y}}{2\alpha}$$

where α is a specified value.

23. The method of claim 22, wherein the method comprises calculating α is calculated using the equation $$\alpha = \frac{2(Y_P - Y_N)}{(Y_P + Y_N)^2}$$

where $Y_p$ is the magnitude of an average positive peak of a digital input signal waveform and $Y_N$ is the magnitude of an average negative peak of the digital input signal waveform.

24. The method of claim 23, further comprising measuring the magnitude of the positive and negative peaks of the analog signal.

25. The method of claim 24, further comprising calculating a plurality of modified digital signal values from a plurality of digital input signal values and storing the modified digital signal values to the look-up module or the digital input signal values.

26. An apparatus to mitigate asymmetry, the apparatus comprising:

means for converting a sample of an analog signal that oscillates about a specified reference level to a digital input signal;

means for addressing a look-up module; and means for outputting an addressed digital value as a modified digital signal, wherein the modified digital signal value is a specified function of the digital input signal value, that is configured to mitigate the asymmetry of the digital input signal.

* * * * *